(12) United States Patent
Frank et al.

(10) Patent No.: US 8,901,616 B2
(45) Date of Patent: Dec. 2, 2014

(54) GATE STACK INCLUDING A HIGH-K GATE DIELECTRIC THAT IS OPTIMIZED FOR LOW VOLTAGE APPLICATIONS

(71) Applicant: International Business Machines Corporation, Armonk, NY (US)

(72) Inventors: Martin M. Frank, Dobbs Ferry, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/027,398

(22) Filed: Sep. 16, 2013

(65) Prior Publication Data

US 2014/0252493 A1     Sep. 11, 2014

Related U.S. Application Data

(63) Continuation of application No. 13/793,290, filed on Mar. 11, 2013.

(51) Int. Cl.
*H01L 31/113* (2006.01)
*H01L 21/336* (2006.01)
*H01L 21/31* (2006.01)
*H01L 29/51* (2006.01)
*H01L 27/092* (2006.01)
*H01L 29/78* (2006.01)

(52) U.S. Cl.
CPC ............ *H01L 29/517* (2013.01); *H01L 27/092* (2013.01); *H01L 29/78* (2013.01); *H01L 29/518* (2013.01)

USPC ........... 257/213; 257/410; 257/411; 438/287; 438/785

(58) Field of Classification Search
CPC . H01L 29/78; H01L 27/1203; H01L 29/4908; H01L 21/28035; H01L 29/518; H01L 29/513; H01L 29/517; H01L 29/6659; H01L 29/665
USPC .......... 438/287, 303, 308, 785, 795; 257/213, 257/410–412
See application file for complete search history.

(56) References Cited

U.S. PATENT DOCUMENTS

| | | | |
|---|---|---|---|
| 7,226,831 B1 | 6/2007 | Metz et al. | |
| 7,682,917 B2 | 3/2010 | Bedell et al. | |
| 7,998,832 B2 | 8/2011 | Carter et al. | |
| 2007/0090471 A1* | 4/2007 | Cartier et al. | ................. 257/411 |

(Continued)

*Primary Examiner* — Hsien Ming Lee
(74) *Attorney, Agent, or Firm* — Scully, Scott, Murphy & Presser, P.C.; Louis J. Percello, Esq.

(57) ABSTRACT

A method of forming a semiconductor device that includes forming a high-k gate dielectric layer on a semiconductor substrate, wherein an oxide containing interfacial layer can be present between the high-k gate dielectric layer and the semiconductor substrate. A scavenging metal stack may be formed on the high-k gate dielectric layer. An annealing process may be applied to the scavenging metal stack during which the scavenging metal stack removes oxide material from the oxide containing interfacial layer, wherein the oxide containing interfacial layer is thinned by removing of the oxide material. A gate conductor layer is formed on the high-k gate dielectric layer. The gate conductor layer and the high-k gate dielectric layer are then patterned to provide a gate structure. A source region and a drain region are then formed on opposing sides of the gate structure.

10 Claims, 2 Drawing Sheets

(56) References Cited

U.S. PATENT DOCUMENTS

| | | |
|---|---|---|
| 2010/0244206 A1 | 9/2010 | Bu et al. |
| 2010/0320547 A1 | 12/2010 | Ando et al. |
| 2011/0207280 A1 | 8/2011 | Ando et al. |
| 2011/0254106 A1* | 10/2011 | Katakami et al. ............ 257/410 |
| 2011/0298053 A1 | 12/2011 | Zhong et al. |
| 2012/0083110 A1 | 4/2012 | Huguenin et al. |
| 2012/0187523 A1* | 7/2012 | Cummings et al. ........... 257/506 |
| 2012/0280288 A1 | 11/2012 | Ando et al. |
| 2013/0075833 A1 | 3/2013 | Liu et al. |

* cited by examiner

GATE STACK INCLUDING A HIGH-K GATE DIELECTRIC THAT IS OPTIMIZED FOR LOW VOLTAGE APPLICATIONS

CROSS REFERENCE TO RELATED APPLICATION

This application is a continuation of U.S. patent application Ser. No. 13/793,290, filed Mar. 11, 2013 the entire content and disclosure of which is incorporated herein by reference.

BACKGROUND

The present disclosure relates generally to semiconductor integrated circuits. More particularly, the present disclosure relates to scaling of semiconductor devices, such as metal oxide semiconductor field effect transistors. In order to be able to make integrated circuits, such as memory, logic and other devices, of higher integration density than currently feasible, one has to find ways to further downscale the dimensions of field effect transistors, such as metal oxide semiconductor field effect transistor and complementary metal oxide semiconductors. Scaling achieves compactness and improves operating performance in devices by shrinking the overall dimensions of the device.

SUMMARY

In one embodiment, the present disclosure provides a method of forming a semiconductor device that may begin with forming a high-k gate dielectric layer on a semiconductor substrate, wherein an oxide containing interfacial layer can be present between the high-k gate dielectric layer and the semiconductor substrate. A scavenging metal stack is formed on the high-k gate dielectric layer. An anneal process is applied, wherein during the anneal process the scavenging metal stack removes oxide material from the oxide containing interfacial layer. The oxide containing interfacial layer is thinned by removing the oxide material during the anneal process. The scavenging metal stack may then be removed. A gate conductor layer of a semiconducting material is formed on the high-k gate dielectric layer. The gate conductor layer of the semiconducting material and the high-k gate dielectric layer is patterned to provide a gate structure. A source region and a drain region are formed on opposing sides of the gate structure.

In another embodiment, a method of forming a semiconductor device is provided that includes forming a high-k gate dielectric layer on a semiconductor substrate, wherein an n-type conductivity device region and a p-type conductivity device region are present in the semiconductor substrate. An oxide containing interfacial layer can be present between the high-k gate dielectric layer and the semiconductor substrate. An n-type work function adjustment layer is formed on a first portion of the high-k gate dielectric over the n-type conductivity device region. A p-type work function adjustment layer is formed on a second portion of the high-k gate over the p-type device region. A first dopant is diffused from the n-type work function adjustment layer to the first portion of the high-k gate dielectric layer and a second dopant is diffused from the p-type work function adjustment layer to the second portion of the high-k gate dielectric layer. The n-type work function adjustment layer and the p-type work function adjustment layer may then be removed. A scavenging metal stack is formed on the high-k gate dielectric layer. An anneal process may be applied, in which during the anneal process the scavenging metal stack removes oxide material from the oxide containing interfacial layer. Removing the oxide material thins the oxide containing interfacial layer. An n-type semiconductor device is formed in the n-type conductivity device region and a p-type semiconductor device is formed in the p-type conductivity device region. A portion of the high-k gate dielectric layer and the oxide containing interfacial layer is present in a gate structure including a semiconductor material gate conductor to each of the n-type semiconductor device and the p-type semiconductor device. In one embodiment, the gate structure for the n-type semiconductor device has an upper surface that is coplanar with the gate structure for the p-type semiconductor device.

In another aspect, a semiconductor device is provided that includes a semiconductor substrate having a channel region, a source region and a drain region. The source region and the drain region are on opposing sides of the channel region. A gate structure may be present on the channel region of the semiconductor substrate. The gate structure may include an oxide containing interfacial layer that is in direct contact with the channel region, a high-k gate dielectric layer that is present on the oxide containing interfacial layer, and a semiconducting material gate conductor that is in direct contact with the high-k gate dielectric layer. The oxide containing interfacial layer has a thickness of 5 Å or less.

In another aspect, a complementary metal oxide semiconductor device is provided that includes a semiconductor substrate having an n-type conductivity device region and a p-type conductivity device region. An n-type semiconductor device is present in the n-type conductivity device region. The n-type semiconductor device includes a first gate structure on a first channel portion of the n-type conductivity device region and n-type source and drain regions on opposing sides of the first channel portion. The first gate structure includes a first oxide containing interfacial layer that is in direct contact with the first channel portion, a first high-k gate dielectric layer that is present on the first oxide containing interfacial layer, and a first semiconducting material gate conductor that is present on the first high-k gate dielectric layer. The first oxide containing interfacial layer of the first gate structure has a thickness of 5 Å or less. A p-type semiconductor device is present in the p-type conductivity device region. The p-type semiconductor device includes a second gate structure on a second channel portion of the p-type semiconductor device region and p-type source and drain regions on opposing sides of the second channel portion. The second gate structure includes a second interfacial oxide containing layer that is in direct contact with the second channel portion, a second high-k gate dielectric layer that is present on the second interfacial oxide containing layer, and a second semiconducting material gate conductor that is present on the second high-k gate dielectric layer. The second interfacial oxide containing layer has a thickness of 5 Å or less. In one embodiment, the gate structure for the n-type semiconductor device has an upper surface that is coplanar with the gate structure for the p-type semiconductor device.

DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
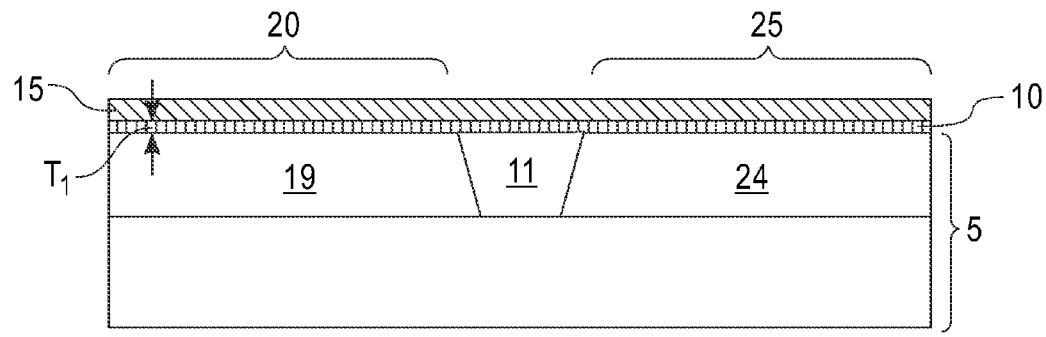
FIG. 1 is a side cross-sectional view depicting forming a high-k gate dielectric layer on a semiconductor substrate, wherein an oxide containing interfacial layer can be present between the high-k gate dielectric layer and the semiconductor substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "vertical", "horizontal", "top", "bottom", and derivatives thereof shall relate to the disclosed structures and methods, as oriented in the drawing figures.

In complementary metal oxide semiconductor scaling, applications with low threshold voltage (Vdd) and low power requirements drive gate stack scaling towards a different optimization point then high performance logic tends to. For example, carrier depletion in a semiconductor electrode is not really a disadvantage for semiconductor devices having a low voltage threshold (Vdd), where the impact is very little, if any, and depletion in the gate electrode would tend to benefit reliability, and therefore, potentionally enable more aggressive dielectric scaling and better electrostatic channel control, which is a good fit for devices having a low threshold voltage (Vdd). Additional dielectric scaling for lower threshold voltage (Vdd) applications is important, as will drive off currents to be lower at a given device channel length and operational voltage. In the methods and structures disclosed herein, a gate structure is provided in which scaling for the equivalent oxide thickness (EOT) is optimized for lower threshold voltage (Vdd) operation with intentional gate depletion.

While gate depletion is generally considered to be undesirable because of increased equivalent oxide thickness at high field, at low Vdd there is minimal equivalent oxide thickness impact from gate depletion. In the common case where a complementary metal oxide semiconductor chip is operated by the manufacturer at higher Vdd and temperature for a short period as a stress test, the so-called "burn-in" process, the larger equivalent oxide thickness which is experienced at this high Vdd can be desirable. Burn-in is practiced to identify marginal parts so that they can be discarded before shipment to customers, but the process reduces the chip performance because of degradation to the gate dielectric that occurs. The reduced electric field resulting from the larger equivalent oxide thickness of a depleted gate is preferable to the non-depleted case because it results in less degradation of the gate dielectric during burn in, and thus better preserves product performance.

FIGS. 1-5 depict one embodiment of a method for forming a semiconductor device 100a, 100b in which a scavenging metal stack 30 may be formed on a high-k gate dielectric layer 15. During a subsequent anneal process, the scavenging metal stack 30 removes oxide from an oxide containing interfacial layer 10 that is underlying the high-k gate dielectric layer 15. By scavenging the oxide from the oxide containing interfacial layer 10, the oxide containing interfacial layer 10 can be thinned. The semiconductor device 100a, 100b may be any semiconductor device that includes a gate structure 40a, 40b. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity. Although, FIGS. 1-5 of the present disclosure depicts a field effect transistor (FET), any semiconductor device having a gate structure 40a, 40b is applicable to the present disclosure.

FIG. 1 depicts one embodiment of forming a high-k gate dielectric layer 15 on a semiconductor substrate 5, wherein an oxide containing interfacial layer 10 can be present between the high-k gate dielectric layer 15 and the semiconductor substrate 5. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

In one embodiment, the semiconductor substrate 5 includes an n-type conductivity device region 20 and a p-type conductivity device region 25 that are separated by an isolation region 11. The isolation region 11 may be shallow trench isolation (STI) region that is formed by etching a trench in the semiconductor substrate 5 utilizing a dry etching process, such as reactive-ion etching (RIE) or plasma etching. Chemical vapor deposition (CVD) or another like deposition process may then be used to fill the trench with a dielectric material. A planarization process, such as chemical-mechanical polishing (CMP) may optionally be used to provide a planar structure. The n-type conductivity device region 20 of the semiconductor substrate 5 can provide the site for subsequently formed p-type semiconductor devices, and the p-type conductivity device region 25 can provide the site for subsequently formed n-type semiconductor devices. The term "conductivity type" denotes whether the semiconductor device has a p-type conductivity or an n-type conductivity. For example, an n-type semiconductor device, such as an n-type field effect transistor, may have a source region and a drain region that is doped to an n-type conductivity. A p-type semiconductor device, such as a p-type field effect transistor, may have a source region and a drain region that is doped to a p-type conductivity. The semiconductor substrate 5 may also include a doped (n- or p-) region. For clarity, the doped regions are not specifically labeled in the drawings of the present application. These doped regions are known as "wells". The n-type conductivity device region 20 may be doped to have a p-type well, and the p-type conductivity device region 25 may be doped to have an n-type well. The dopant for the well regions may be introduced to the semiconductor substrate 5 using ion implantation.

In some embodiments, an active portion 19 of the semiconductor substrate 5 that is present in the n-type conductivity device region 20 has a silicon containing composition, such as silicon, and an active portion 24 of the p-type conductivity device region 25 has a silicon and germanium containing composition, such as silicon germanium (SiGe). To provide the active portion 24 of the p-type conductivity device region 25, a silicon germanium containing layer may be deposited atop the semiconductor substrate 5 in the p-type conductivity device region 25. The silicon germanium containing layer may be deposited using chemical vapor deposition. Chemical vapor deposition methods suitable for forming the silicon germanium containing layer may include atmospheric pressure chemical vapor deposition, low pressure chemical vapor deposition and plasma enhanced chemical vapor deposition, metal organic chemical vapor deposition and combinations thereof. The silicon germanium containing composition that provides the active portion 24 of the p-type conductivity device region 25 may also be deposited using evaporation, chemical solution deposition, spin on deposition, and physical vapor deposition methods. In some examples, the silicon germanium containing composition that provides the active portion 24 of the p-type conductivity device region 25 may also be deposited using an epitaxial deposition process.

Still referring to FIG. 1, a high-k gate dielectric layer 15 may be formed on the semiconductor substrate 5. The term "high-k" denotes a material having a dielectric constant that is greater than the dielectric constant of silicon oxide ($SiO_2$). For example, the high-k gate dielectric layer 15 can have a dielectric constant that is greater than 3.9. In another example, the high-k gate dielectric layer 15 has a dielectric constant that is greater than 10. In yet another embodiment, the high-k gate dielectric layer 15 is comprised of a material having a dielectric constant ranging from 10 to 30. The dielectric constants mentioned herein are relative to a vacuum at room temperature, i.e., 20° C. to 25° C.

The high-k gate dielectric layer 15 can include at least one metallic element. Some examples of high-k dielectric materials suitable for the high-k gate dielectric layer 15 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In some embodiments, the high-k dielectric employed as the high-k gate dielectric layer 15 is selected from the group consisting of hafnium oxide ($HfO_2$), zirconium oxide ($ZrO_2$), aluminum oxide ($Al_2O_3$), hafnium silicate (HfSiO), nitrided hafnium silicate (HfSiON), hafnium oxynitride ($HfO_xN_y$), lanthanum oxide ($La_3O_2$), lanthanum aluminate ($LaAlO_3$), zirconium silicate ($ZrSiO_x$) and combinations thereof. In one embodiment, the high-k gate dielectric layer 15 has a thickness that ranges from 1 nm to 10 nm. In another embodiment, the high-k gate dielectric layer 15 has a thickness that ranges from 1 nm to 4 nm.

The high-k gate dielectric layer 15 is typically formed using a deposition process, such as chemical vapor deposition. Variations of chemical vapor deposition processes for depositing the high-k gate dielectric layer 15 include, but are not limited to, atmospheric pressure chemical vapor deposition, low pressure chemical vapor deposition, plasma enhanced chemical vapor deposition, metal organic chemical vapor deposition and combinations thereof. In yet another embodiment, the high-k gate dielectric layer 15 may be formed using physical vapor deposition (PVD). In still yet another embodiment, the high-k gate dielectric layer 15 may be formed using atomic layer deposition (ALD).

In some embodiments, an oxide containing interfacial layer 10 is present between the upper surface of the semiconductor substrate 5 and the high-k gate dielectric layer 15. The oxide containing interfacial layer 10 may be composed of an oxide, such as silicon oxide, or oxynitride, such as silicon oxynitride. The oxide containing interfacial layer 10 can be the result of thermal oxidation before or after the formation of the high-k gate dielectric layer 15. The oxide containing interfacial layer 10 may also be a chemical oxide that can be the result of a chemical cleaning composition applied to the semiconductor substrate 5. The oxide containing interfacial layer 10 may have a thickness T1 ranging from 0.5 nm to 5 nm. In another embodiment, the oxide containing interfacial layer 10 may have a thickness T1 ranging from 1 nm to 4 nm. In yet another embodiment, the oxide containing interfacial dielectric layer 10 may have a thickness T1 ranging from 2 nm to 3 nm.

Figure 2:
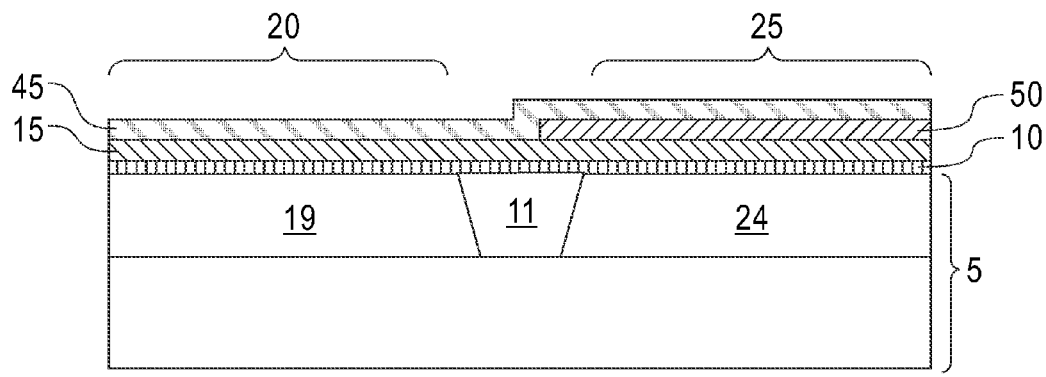
FIG. 2 is a side cross-sectional view depicting forming an n-type work function adjustment layer on a first portion of the high-k gate dielectric layer that is present over the n-type conductivity device region of a semiconductor substrate, and forming a p-type work function adjustment layer on a second portion of the high-k gate dielectric layer that is present over the p-type conductivity device region.

FIG. 2 depicts forming an n-type work function adjustment layer 45 on a first portion of the high-k gate dielectric layer 15 that is present over the n-type conductivity device region 20 of the semiconductor substrate 5, and forming a p-type work function adjustment layer 50 on a second portion of the high-k gate dielectric layer 15 that is present over the p-type conductivity device region 25. As used herein, an "n-type work function adjustment layer" is a layer from which a dopant can diffuse to the underlying high-k gate dielectric layer 15 to effectuate an n-type (i.e., negative) threshold voltage shift, i.e., a threshold voltage shift that results in a negative threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. As used herein, a "p-type work function adjustment layer" is layer from which a dopant can diffuse to the underlying high-k gate dielectric to effectuate a p-type (i.e., positive) threshold voltage shift. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function adjustment layer 50 is first formed on the semiconductor substrate 5. The p-type work function adjustment layer 50 may include an aluminum containing layer, wherein aluminum dopant from the aluminum containing layer may diffuse to the high-k gate dielectric layer 15 to adjust the threshold voltage of the channel for the later formed p-type semiconductor device that is present in the p-type conductivity device region 25. The aluminum containing layer may have a thickness ranging from 1 Å to 40 Å. In another embodiment, the aluminum containing layer may have a thickness ranging from 1 Å to 20 Å. In yet another embodiment, the thickness of the aluminum containing layer may range from 5 Å to 10 Å. The p-type work function adjustment layer 50 may be a multilayered stack. For example, the p-type work function adjustment layer 50 may include a first metal nitride layer that is present on the high-k gate dielectric layer 15, an aluminum containing layer that is present on the first metal nitride layer, and a second metal nitride layer that is present on the aluminum containing layer. In some embodiments, at least one of the first metal nitride layer and the second metal nitride layer is composed of a metal nitride that is selected from the group consisting of titanium nitride, tantalum nitride, tungsten nitride and a combination thereof. Each of first and second metal layers may have a thickness ranging from 1 Å to 100 Å. In another embodiment, each of the first and second metal layers may have a thickness ranging from 10 Å to 80 Å. In yet another embodiment, each of the first and second metal layers may have a thickness ranging from 30 Å to 50 Å.

The p-type work function adjustment layer 50 may be blanket deposited on the high-k gate dielectric layer 15, and patterned and etched to remove the portion of the p-type work function adjustment layer 50 that is present over the n-type conductivity device region 20 so that a remaining portion of the p-type work function adjustment layer 50 is present over the p-type conductivity device region 25. The p-type work function adjustment layer 50 may be deposited using chemical vapor deposition or physical vapor deposition. For example, each layer of the p-type work function adjustment layer 50 may be deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering processes that are suitable for depositing the p-type work function adjustment layer 50 include DC diode type systems, radio frequency (RF) sputtering, magnetron sputtering, and ionized metal plasma (IMP) sputtering. Following deposition, the p-type work function adjustment layer 50 may be patterned and etched by applying a photoresist layer to the upper surface of the p-type work function adjustment layer 50, exposing the photoresist layer to a pattern of radiation, and then developing the pattern into the photoresist layer utilizing a resist developer. The photoresist etch mask may be positioned so that the portions of the p-type work function adjustment layer 50 that are not protected by the photoresist etch mask may be etched in order to provide that the remaining portion of the p-type work function adjustment layer 50 is present in the p-type conductivity device region 25. The etch process may be an anisotropic etch. An "anisotropic etch process" is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Still referring to FIG. 2, following patterning and etching of the p-type work function adjustment layer 50, the n-type work function adjustment layer 45 may be blanket deposited over the remaining portion of the p-type work function adjustment layer 50 that is present in the p-type conductivity device region 25 and on the active portion 19 of the semiconductor substrate 5 that is present in the n-type device region 20. The n-type work function adjustment layer 45 may be a lanthanum (La) containing layer, wherein a lanthanum dopant from the lanthanum containing layer may diffuse to the high-k gate dielectric layer 15 to adjust the threshold voltage of the channel for the later formed n-type semiconductor device that is present in the n-type conductivity device region 20. The lanthanum containing layer may have a thickness ranging from 1 Å to 40 Å. In another embodiment, the lanthanum containing layer may have a thickness ranging from 1 Å to 20 Å. In yet another embodiment, the thickness of the lanthanum containing layer may range from 5 Å to 10 Å. Similar to the p-type work function adjustment layer 50, the n-type conductivity device region 20 may be deposited using a chemical vapor deposition process or a physical vapor deposition process. The above description of the sputtering processes for forming the p-type work function adjustment layer 50 is suitable for the description of depositing the n-type work function adjustment layer 45.

In some embodiments, a first semiconductor containing layer (not shown) may be formed overlying the n-type work function adjustment layer 45 and the p-type work function adjustment layer 50. The first semiconductor containing layer may be a silicon containing material. Examples of silicon containing materials that are suitable for the first semiconductor containing layer include, but are not limited to, silicon (Si), single crystal silicon, polycrystalline silicon, amorphous silicon (α-Si), Si doped with C (Si:C) and the above-mentioned silicon-containing materials with some or all of the Si replaced by Ge. Other examples of semiconductor materials that are suitable for the first semiconductor containing layer may include GaSb, GaP, GaAs, InAs, InP, and all other III-V or II-VI compound semiconductors. In some embodiments, the first semiconductor containing layer is deposited using a physical vapor deposition, chemical vapor deposition or atomic layer deposition process.

An anneal process may be performed on the semiconductor substrate 5 after the first semiconductor containing layer is formed on the n-type work function adjustment layer 45 and the p-type work function adjustment layer 50. In some embodiments, during the anneal process, the atoms from the p-type work function adjustment layer 50 and the n-type work function adjustment layer 45 diffuse to the underlying portion of the high-k gate dielectric layer 15 to adjust the threshold voltage of the channel for the later formed semiconductor devices in the n-type conductivity device region 20 and the p-type conductivity device region 25. The anneal process may be at elevated temperatures in the range of approximately 800° C. to 1200° C. In another embodiment, the anneal process may be at a temperature ranging from 900° C. to 1100° C. The anneal process may be provided by at least one of a rapid thermal anneal (RTA) process, a laser-based anneal process, a flashlight-based anneal process or a combination thereof.

Following annealing to diffuse the atoms from the p-type work function adjustment layer 50 and the n-type work function adjustment layer 45 to the underlying portion of the high-k gate dielectric layer 15, the first semiconductor containing layer, the p-type work function adjustment layer 50 and the n-type work function adjustment layer 45 may be removed. For example, the first semiconductor containing layer, the p-type work function adjustment layer 50 and the n-type work function adjustment layer 45 may be removed using an etch process that is selective to the high-k gate dielectric layer 15. For example, the etch process for removing the first semiconductor containing layer, the p-type work function adjustment layer 50 and the n-type work function adjustment layer 45 may include a hydrofluoric containing etch, such as dilute hydrofluoric (DHF), an ammonia containing etch, such as hot $NH_3$, tetramethyl ammonium hydroxide (TMAH) or a combination thereof.

In some embodiments, the above process sequence of forming the n-type work function adjustment layer 45, the p-type work function adjustment layer 50 and the first semiconductor containing layer, as well as the anneal process for diffusing the atoms from the p-type work function adjustment layer 50 and the n-type work function adjustment layer 45 to the underlying portion of the high-k gate dielectric layer 15 to adjust the threshold voltage of the subsequently formed semiconductor devices may be omitted.

Figure 3:
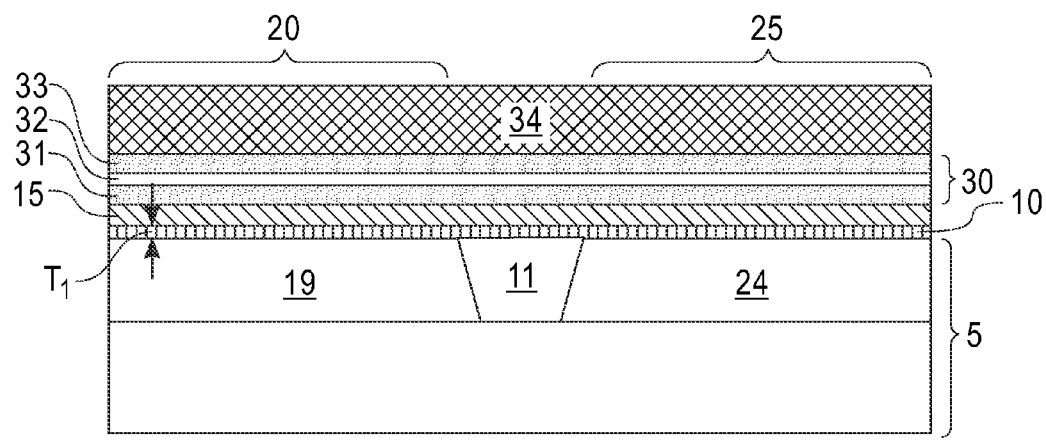
FIG. 3 is a side cross-sectional view depicting forming a scavenging metal stack on the high-k gate dielectric layer and performing an anneal process during which the scavenging metal stack removes oxide material from the oxide containing interfacial layer, wherein the oxide containing interfacial layer is thinned by removing of the oxide material, in accordance with one embodiment of the present disclosure.

FIG. 3 depicts one embodiment of forming a scavenging metal stack 30 on the high-k gate dielectric layer 15 and performing, another anneal process. During this anneal process, the scavenging metal stack 30 removes oxide material from the oxide containing interfacial layer 10. In one embodiment, the scavenging metal stack 30 includes a first metal nitride layer 31 on the high-k gate dielectric layer 15, a scavenging metal layer 32 on the first metal nitride layer 31 and a second metal nitride layer 33 on the scavenging metal layer 32. In one embodiment, the scavenging metal layer 32 is composed of aluminum. In one example, the scavenging metal layer 32 may be composed of 95% or greater aluminum. In another example, the scavenging metal layer 32 may be composed of 99% or greater aluminum. In yet another example, the scavenging metal layer 32 is 100% aluminum. It is noted that the above compositions for the scavenging metal layer 32 are provided for illustrative purposes only and are not intended to limit the present disclosure. For example, the scavenging metal layer 32 may also be composed of Al, Ti, TaAlN, $TiN_{(1-x)}$ (substioichiometric TiN) or a combination thereof. The thickness of the scavenging metal layer 32 may range from 1 Å to 40 Å. In another embodiment, the scavenging metal layer 32 may have a thickness ranging from 1 Å to 20 Å. In yet another embodiment, the thickness of the scavenging metal layer 32 may range from 5 Å to 10 Å. In some embodiments, at least one of the first metal nitride layer 31 and the second metal nitride layer 33 of the scavenging metal stack 30 are composed of a metal nitride that is selected from the group consisting of titanium nitride, tantalum nitride, tungsten nitride and a combination thereof. Each of first and second metal layers 31, 33 of the scavenging metal stack 30 may have a thickness ranging from 1 Å to 100 Å. In another embodiment, each of the first and second metal layers 31, 33 of the scavenging metal stack 30 may have a thickness ranging from 10 Å to 80 Å. In yet another embodiment, each of the first and second metal layers 31, 33 of the scavenging metal stack 30 may have a thickness ranging from 30 Å to 50 Å.

The scavenging metal stack 30 may be formed using at least one of chemical vapor deposition, physical vapor deposition, evaporation, chemical solution deposition, spin on deposition or a combination thereof. For example, each of the layers of the scavenging metal stack 30 may be formed using a sputtering process, such as DC diode type systems, radio frequency (RF) sputtering, magnetron sputtering, and ionized metal plasma (IMP) sputtering. In one example, in which the scavenging metal layer 32 of the scavenging metal stack 30 are composed of an aluminum containing material, the aluminum containing material can be sputtered from a solid aluminum target. In another example, in which the first and second metal nitride layers 31, 33 of the scavenging metal stack 30 are composed of titanium nitride, the titanium nitride can be sputtered from a solid titanium target, in which the nitrogen content of the metal nitride layer is introduced by a nitrogen gas. In yet another example, the first and second metal nitride layers 31, 33 composed of titanium nitride can be sputtered from a solid target comprised of titanium and nitrogen.

In some embodiments, a second semiconductor containing layer 34 may be formed overlying the scavenging metal stack 30. The second semiconductor containing layer 34 may be a silicon containing material. Examples of silicon containing materials that are suitable for the second semiconductor containing layer 34 include, but are not limited to, silicon (Si), single crystal silicon, polycrystalline silicon, amorphous silicon (α-Si), Si doped with C (Si:C) and the above-mentioned silicon-containing materials with some or all of the Si replaced by Ge. Other examples of semiconductor materials that are suitable for the second semiconductor containing layer 34 may include GaSb, GaP, GaAs, InAs, InP, and all other III-V or II-VI compound semiconductors. In some embodiments, the second semiconductor containing layer 34 is deposited using a physical vapor deposition, chemical vapor deposition or atomic layer deposition process. The thickness of second semiconductor containing layer 34 is typically between 1 nm and 50 nm. In some embodiments, the thickness of the second semiconductor containing layer 34 ranges from 5 nm to 25 nm.

Figure 4:
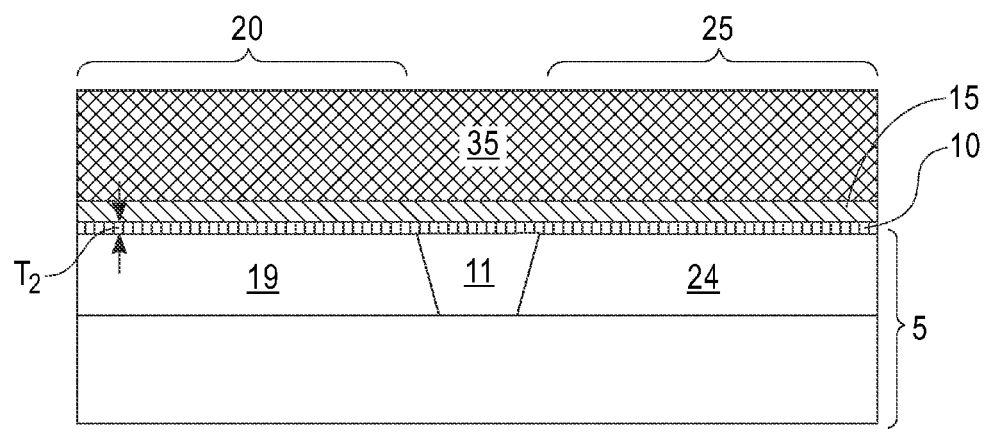
FIG. 4 is a side cross-sectional view depicting removing the scavenging metal stack and forming a semiconducting material gate conductor layer of the high-k gate dielectric layer, in accordance with one embodiment of the present disclosure.

Referring to FIGS. 3 and 4, following deposition of the scavenging metal stack 30 and the second semiconductor containing layer 34, an anneal process is performed during which the scavenging metal layer 32 of the scavenging metal stack 30 removes oxide from the oxide containing interfacial layer 15. By removing the oxide material from the oxide containing interfacial layer 15, the thickness of the oxide containing interfacial layer 15 is reduced. The anneal process may be at elevated temperatures in the range of approximately 800° C. to 1200° C. In another embodiment, the anneal process may be at a temperature ranging from 900° C. to 1100° C. The anneal process may be provided by at least one of a rapid thermal anneal (RTA) process, a laser-based anneal process, a flashlight-based anneal process or a combination thereof.

In some embodiments, during the anneal process, the scavenging metal stack 30 removes oxide from the oxide containing interfacial layer 10, wherein the oxide containing interfacial layer 10 before the annealing process had a thickness greater than 1 nm, and after the annealing process the oxide containing interfacial layer 10 had a thickness ranging from 1 Å to 8 Å. In another embodiment, during the anneal process the scavenging metal stack 30 removes oxide from the oxide containing interfacial layer 10, wherein the oxide containing interfacial layer 10 before the annealing process had a thickness greater than 1 nm, and after the annealing process the oxide containing interfacial layer 10 has a thickness ranging from 2 Å to 5 Å.

FIG. 4 depicts removing the second semiconductor containing layer 34 and scavenging metal stack 30 to expose the high-k gate dielectric layer 15, and forming a third semiconductor containing layer 35 on the high-k gate dielectric layer 15. The third semiconductor containing layer 35 is composed of a semiconducting material and provides the gate conductor of the subsequently formed semiconductor devices that are present in the n-type conductivity device region 20 and the p-type conductivity device region 25. In one embodiment, the third semiconductor containing layer 35 is formed in direct contact with the high-k gate dielectric layer 15. The term "direct contact" means that a first element, such as a first structure, and a second element, such as a second structure, are connected without any intermediary conducting, insulating or semiconductor layers at the interface of the two elements.

The third semiconductor containing layer 35 may be a silicon containing material. The third semiconductor containing layer 35 is composed of a semiconducting material, and is later processed to provide a semiconductor material gate conductor. Examples of silicon containing materials that are suitable for the third semiconductor containing layer 35 include, but are not limited to, silicon (Si), single crystal silicon, polycrystalline silicon, amorphous silicon (α-Si), Si doped with C (Si:C) and the above-mentioned silicon-containing materials with some or all of the Si replaced by Ge. Other examples of semiconductor materials that are suitable for the third semiconductor containing layer 35 may include GaSb, GaP, GaAs, InAs, InP, and all other III-V or II-VI compound semiconductors. Metal semiconductor alloys, such as silicides, are not materials typically employed for the third semiconductor containing layer 35. In some embodiments, the third semiconductor containing layer 35 is deposited using a physical vapor deposition, chemical vapor deposition or atomic layer deposition process. The thickness of third semiconductor containing layer 35 is typically between 1 nm and 50 nm. In some embodiments, the thickness of the third semiconductor containing layer 35 ranges from 5 nm to 25 nm. In some examples, the third semiconductor containing layer 35 is composed of polysilicon. The third semiconductor containing layer 35 may be doped. For example, when the third semiconductor containing layer 35 is a type IV semiconductor material, such as a silicon containing semiconductor material, the third semiconductor containing layer may be doped with a p-type or n-type dopant.

Figure 5:
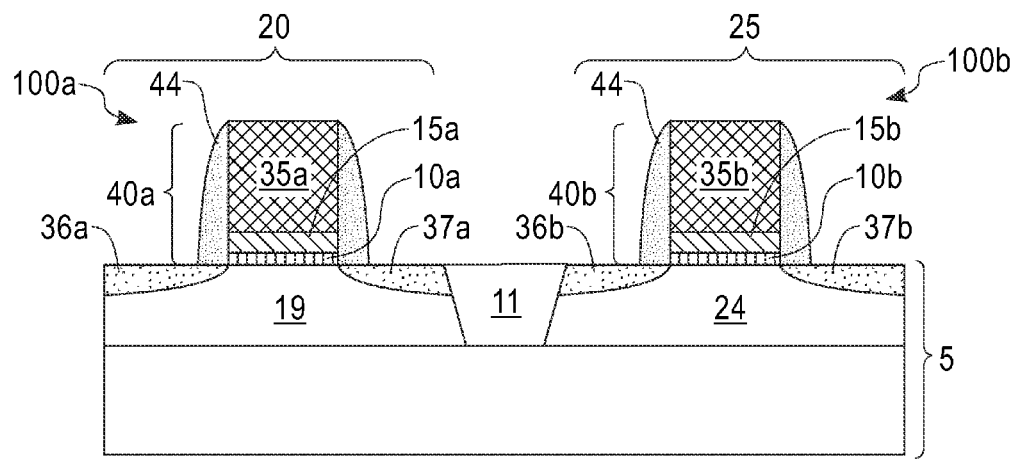
FIG. 5 is a side cross-sectional view depicting forming a n-type semiconductor device in the n-type conductivity device region and a p-type semiconductor device in the p-type conductivity device region, wherein a portion of the high-k gate dielectric layer and the oxide containing interfacial layer is present in a gate structure to each of the n-type semiconductor device and the p-type semiconductor device, in accordance with one embodiment of the present disclosure.

FIG. 5 depicts forming an n-type semiconductor device 100a, such as an n-type field effect transistor, in the n-type conductivity device region 20 and a p-type semiconductor device 100b, such as a p-type field effect transistor, in the p-type conductivity device region 25, wherein a portion of the high-k gate dielectric layer 15a, 15b and the oxide containing interfacial layer 10a, 10b is present in a gate structure 40a, 40b to each of the n-type semiconductor device 100a and the p-type semiconductor device 100b.

FIG. 5 depicts patterning the material stack composed of the oxide containing interfacial layer 10, the high-k gate dielectric layer 15 and the third semiconductor containing layer 35 to provide a first gate structure 40a in the n-type conductivity device region 20 and a second gate structure 40b in the p-type conductivity device region 25. In some embodiments, the gate structures 40a, 40b may be patterned using photolithography and etching. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The gate structures 40a, 40b control output current, i.e., flow of carriers in the channel, of the semiconducting devices 100a, 100b, such as a field effect transistor (FET), through electrical or magnetic fields. The channel of each semiconductor device 100a, 100b is the region between the source region and the drain region of a semiconductor device that becomes conductive when the semiconductor device is turned on. The first gate structure 40a that is present in the n-type semiconductor device region 20 may include a first portion of the oxide containing interfacial layer 10a, the high-k gate dielectric layer 15a and the third semiconductor containing layer 35a. The second gate structure 40b that is present in the p-type semiconductor device region 25 may include a second portion of the oxide containing interfacial layer 10b, the high-k gate dielectric layer 15b and the third semiconductor containing layer 35b.

Referring to FIG. 5, source regions 36a, 36b and drain regions 37a, 37b may be formed in the semiconductor substrate 5. The source regions 36a, 36b are the doped regions in the semiconductor devices 100a, 100b, in which majority carriers are flowing into the channel portion of the semiconductor substrate 5. The drain regions 37a, 37b are the doped regions in the semiconductor device 100a, 100b that are located at the end of the channel portions of the semiconductor substrate 5, in which carriers are flowing out of the semiconductor devices 100a, 100b through the drain regions 37a, 37b. The source and drain regions 36a, 36b, 37a, 37b may be formed via ion implantation. When the semiconductor device 100b is a p-type conductivity semiconductor device, the source and drain extension regions 19, 24 may be doped with a p-type dopant. As used herein, "p-type" refers to the addition of impurities to an intrinsic semiconductor that creates deficiencies of valence electrons. The p-type conductivity semiconductor devices 100b are typically produced within silicon containing substrates by doping the source and drain regions 36a, 37a adjacent to the gate structure 40a with elements from group III-A of the Periodic Table of Elements. In a silicon containing substrate, examples of p-type dopants, i.e., impurities, include but are not limited to boron, aluminum, gallium and indium. When the semiconductor device 100a is an n-type semiconductor device, the source and drain regions 36b, 37b may be doped with an n-type dopant. As used herein, "n-type" refers to the addition of impurities that contributes free electrons to an intrinsic semiconductor. The n-type conductivity semiconductor devices are typically produced within silicon containing substrates by doping the source and drain regions 36b, 37b with elements from group V-A of the Periodic Table of Elements. In a silicon containing substrate, examples of n-type dopants, i.e., impurities, include but are not limited to, antimony, arsenic and phosphorous. The source and drain regions 36a, 36b, 37a, 37b that are depicted in FIG. 5 may be referred to as source and drain extension regions.

Still referring to FIG. 5, in one embodiment, a gate sidewall spacer 44 is formed adjoining the sidewall surfaces of the gate structures 40a, 40b. In one embodiment, the gate sidewall spacer 44 is composed of silicon oxide, silicon nitride, boron nitride, silicon carbon or any suitable combination of those materials. The gate sidewall spacer 15 may be formed by deposition and etching. Typically, the widths of the gate sidewall spacer 44 should be sufficiently wide enough so that the following deep source/drain implants also do not encroach significantly into the channel portion of the semiconductor substrate 5 to cause short channel effects in the semiconductor device 100a, 100b. In one embodiment, the gate sidewall spacer 44 has a width measured at the bottom of the spacer that is no greater than 20 nm.

Still referring to FIG. 5, in one embodiment, a higher energy ion implant than the ion implant used to form the source and drain extension regions 36a, 36b, 37a, 37b is conducted to form deep source and drain regions (not shown). Typically, these implants are also conducted at higher concentration of dopant than the implant for the source and drain extension regions 36a, 36b, 37a, 37b. The deep source and drain regions are typically doped with a conductivity type consistent with the corresponding source and drain extension regions 36a, 36b, 37a, 37b. In some embodiments, the deep source and drain regions may be omitted. In some embodiments, the source region and the drain region for the semiconductor devices 100a. 100b is a combination of the source and drain extension regions 36a, 36b, 37a, 37b and the optional deep source and drain regions. The source and drain regions can be activated by activation annealing. Activation anneal may be conducted at a temperature ranging from 850° C. to 1350° C.

In one embodiment, a semiconductor device 100a, 100b is provided that includes a semiconductor substrate 5 including a channel region, a source region 36a, 36b and a drain region 37a, 37b. The source region 36a, 36b and the drain region 37a, 37b are on opposing sides of the channel region. A gate structures 40a, 40b are present on the channel regions of the semiconductor substrate 5. The gate structures 40a, 40b include an interfacial oxide containing layer 10a, 10b that is in direct contact with the channel region, a high-k gate dielectric layer 15a, 15b that is present on the interfacial oxide containing layer 10a, 10b, and a semiconductor containing gate conductor 35a, 35b that is present on the high-k gate dielectric layer 15a, 15b. The interfacial oxide containing layer 10a, 10b can have a thickness of 5 Å or less.

The methods and semiconductor devices 100a, 100b that are disclosed herein are suitable for the low voltage, i.e., low threshold voltage (Vdd), semiconductor devices. As used herein, a low voltage, i.e., low threshold voltage (Vdd), semiconductor device has a chip operating voltage that may range from 0.5 volts and 0.8 volts. The semiconductor devices 100a, 100b disclosed herein, which employ semiconducting material gate conductors 35a, 35b that are in direct contact with the high-k gate dielectric layers 15a, 15b, also have improved performance under burn in conditions and increased reliability when compared to similar semiconductor devices that include metal gate conductors. Burn in is a process in which the chip is operated at a higher voltage than the chip will ever be exposed to during operation. Burn in can remove the components on the chip that are below specification by burning them out. In prior semiconductor devices including a gate structure having a metal gate conductor, an electric field can be produced during the burn in process, which can damage the high-k gate dielectric of the gate structure to the semiconductor device. In some embodiments, the semiconductor devices 100a, 100b disclosed herein have a semiconducting material gate conductors 35a, 35b, such as a polysilicon gate conductor, in which the polysilicon gate conductor reduces the strength of the electric field that is formed during the burn in process, which reduces damage to the high-k gate dielectric.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A semiconductor device comprising:
   a semiconductor substrate including a channel region, a source region and a drain region, wherein the source region and the drain region are on opposing sides of the channel region; and
   a gate structure present on the channel region of the semiconductor substrate, wherein the gate structure includes an interfacial oxide containing layer in direct contact with the channel region, a high-k gate dielectric layer that is present on the interfacial oxide containing layer, and a semiconducting material gate conductor in direct contact with the high-k gate dielectric layer, wherein the interfacial oxide containing layer has a thickness of 5 Å or less, wherein the semiconducting material gate conductor of the gate structure reduces a strength of an electric field that is produced during burn in when compared to a similarly structured semiconductor device having a metal gate conductor, and wherein the semiconductor device has an operating voltage ranging from 0.5 volts to 0.8 volts.

2. The semiconductor device of claim 1, wherein the high-k gate dielectric layer is comprised of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof.

3. The semiconductor device of claim 1, wherein the semiconducting material gate conductor comprises silicon (Si), single crystal silicon, polycrystalline silicon, amorphous silicon (α-Si), silicon germanium (SiGe) or a combination thereof, wherein the semiconducting material is doped with a p-type or n-type dopant.

4. The semiconductor device of claim 1, wherein the interfacial oxide containing layer has a thickness ranging from 2 Å to 5 Å, and has a composition of silicon oxide or silicon oxynitride.

5. A complementary metal oxide semiconductor device comprising:
   a semiconductor substrate having an n-type semiconductor device region and a p-type semiconductor device region;
   an n-type semiconductor device present in the n-type semiconductor device region, the n-type semiconductor device including a first gate structure on a first channel portion of the n-type semiconductor device region and n-type source and drain regions on opposing sides of the first channel portion, wherein the first gate structure includes a first interfacial oxide containing layer in direct contact with the channel region, a first high-k gate dielectric layer present on the first interfacial oxide containing layer, and a first semiconducting material gate conductor present on the first high-k gate dielectric layer, wherein the first interfacial oxide containing layer has a thickness of 5 Å or less; and
   a p-type semiconductor device present in the p-type semiconductor device region, the p-type semiconductor device including a second gate structure on a second channel portion of the p-type semiconductor device region and p-type source and drain regions on opposing sides of the second channel portion, wherein the second gate structure includes a second interfacial oxide containing layer in direct contact with the channel region, a second high-k gate dielectric layer present on the second interfacial oxide containing layer, and a second semiconducting material gate conductor present on the second high-k gate dielectric layer, wherein the second interfacial oxide containing layer has a thickness of 5 Å or less, wherein an upper surface of the first gate structure is coplanar with an upper surface of the second gate structure, wherein the complementary metal oxide semiconductor device has an operating voltage ranging from 0.5 volts to 0.8 volts.

6. The semiconductor device of claim 5, wherein at least one of the first and second high-k gate dielectric layer is comprised of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and a combination thereof.

7. The semiconductor device of claim 5, wherein at least one of the first and second semiconducting material gate conductor comprises silicon (Si), single crystal silicon, polycrystalline silicon, amorphous silicon (α-Si), silicon germanium (SiGe) or a combination thereof, wherein the semiconducting material is doped with a p-type or n-type dopant.

8. The semiconductor device of claim 5, wherein a least one of the first and second interfacial oxide containing layer has a thickness ranging from 2 Å to 5 Å, and has a composition of silicon oxide or silicon oxynitride.

9. The semiconductor device of claim 5, wherein the semiconducting material gate conductor of the gate structure reduces a strength of an electric field that is produced during burn in when compared to a similarly structured semiconductor device having a metal gate conductor.

10. A semiconductor device comprising:
  a semiconductor substrate including a channel region, a source region and a drain region, wherein the source region and the drain region are on opposing sides of the channel region; and
  a gate structure present on the channel region of the semiconductor substrate, wherein the gate structure includes an interfacial oxide containing layer in direct contact with the channel region, a high-k gate dielectric layer that is present on the interfacial oxide containing layer, and a semiconducting material gate conductor is in direct contact with the high-k gate dielectric layer, wherein the interfacial oxide containing layer has a thickness of 5 Å or less, wherein the semiconductor device has an operating voltage ranging from 0.5 volts to 0.8 volts.

* * * * *